(12) United States Patent
Schindelholz et al.

(10) Patent No.: US 10,261,120 B1
(45) Date of Patent: Apr. 16, 2019

(54) ARC PLASMA-GENERATING SYSTEMS AND METHODS THEREOF

(71) Applicant: National Technology & Engineering Solutions of Sandia, LLC, Albuquerque, NM (US)

(72) Inventors: Eric John Schindelholz, Albuquerque, NM (US); Kenneth Miguel Armijo, Albuquerque, NM (US); Jay Johnson, Albuquerque, NM (US); Richard Karl Harrison, Albuquerque, NM (US); Benjamin Bing-Yeh Yang, Atlanta, GA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 146 days.

(21) Appl. No.: 15/603,782

(22) Filed: May 24, 2017

Related U.S. Application Data

(60) Provisional application No. 62/342,580, filed on May 27, 2016.

(51) Int. Cl.
*H02H 1/00* (2006.01)
*H02S 50/10* (2014.01)
*G01R 31/02* (2006.01)
*G01R 31/28* (2006.01)

(52) U.S. Cl.
CPC ....... *G01R 31/025* (2013.01); *G01R 31/2846* (2013.01)

(58) Field of Classification Search
CPC ......... A61F 9/06; A61F 9/067; B23K 9/0956; B23K 9/127; B23K 9/1274; G01R 29/08; G02B 2027/0138; G02B 27/01; H01L 27/14687; H01L 31/1013; H01L 27/14641; G07C 5/008
See application file for complete search history.

(56) References Cited

U.S. PATENT DOCUMENTS

| | | | | | |
|---|---|---|---|---|---|
| 4,021,840 | A | * | 5/1977 | Ellsworth | B23K 9/1274 219/124.1 |
| 4,280,137 | A | * | 7/1981 | Ashida | B23K 9/0956 219/124.34 |
| 7,439,744 | B2 | * | 10/2008 | Gass | G01R 31/3272 324/424 |
| 8,138,630 | B2 | | 3/2012 | Dibachi et al. | |
| 8,164,347 | B2 | * | 4/2012 | Schroeder | G01R 31/3272 324/424 |

(Continued)

OTHER PUBLICATIONS

Abbott WH, "Corrosion of electrical contacts: review of flowing mixed gas test developments," *Brit. Corrosion J.* 1989;24(2):153-9 (abstract only, 1 p.).

(Continued)

*Primary Examiner* — Alesa Allgood
(74) *Attorney, Agent, or Firm* — Helen S. Baca (57) ABSTRACT

The present invention relates to systems for generating an arc fault in an electrical circuit, as well as methods thereof. In particular, the system provides a platform that can produce an arc discharge in a controlled manner, while measuring various parameters to characterize that discharge. Such parameters include voltage measurements, current measurements, optical spectroscopy measurements, electron temperatures, and/or plasma temperatures.

18 Claims, 7 Drawing Sheets

(56) References Cited

U.S. PATENT DOCUMENTS

| | | | | |
|---|---|---|---|---|
| 8,463,449 | B2 | 6/2013 | Sanders | |
| 9,977,242 | B2* | 5/2018 | Patel | G01R 29/08 |
| 2008/0173810 | A1* | 7/2008 | Morrisroe | F23C 99/003 |
| | | | | 250/288 |
| 2009/0196801 | A1* | 8/2009 | Mills | B01J 19/088 |
| | | | | 422/186 |
| 2013/0207545 | A1* | 8/2013 | Andrea | G01R 31/14 |
| | | | | 315/112 |
| 2014/0095086 | A1* | 4/2014 | Parker | H02H 1/0015 |
| | | | | 702/58 |
| 2017/0209579 | A1* | 7/2017 | Curley | A61N 1/406 |
| 2017/0227766 | A1* | 8/2017 | Patel | A61F 9/06 |

OTHER PUBLICATIONS

Armijo KM et al., "Characterizing fire danger from low-power photovoltaic arc-faults," *IEEE 40th Photovoltaic Specialist Conference (PVSC)*, held on Jun. 8-13, 2014 in Denver, CO, pp. 3384-3390.

Bower W, "Inverters—critical photovoltaic balance-of-system components: status, issues, and new-millennium opportunities," *Prog. Photovolt. Res. Appl.* 2000;8:113-26.

Brooks B, "The ground-fault protection blind spot: a safety concern for larger photovoltaic systems in the United States," *Solar American Board for Codes and Standards Report*, Jan. 2012, 18 pp.

Burton PD et al., "Application and characterization of an artificial grime for photovoltaic soiling studies," *IEEE J. Photovolt.* 2014;4(1):299-303.

Chudnovsky BH, "Degradation of power contacts in industrial atmosphere: silver corrosion and whiskers," *Proceedings of the Forty-Eighth IEEE Holm Conference on Electrical Contacts*, held on Oct. 23, 2002 in Orlando, FL, pp. 140-150.

Dhere NG, "Reliability of PV modules and balance-of-system components," *Conference Record of the 31st IEEE Photovoltaic Specialists Conference*, held on Jan. 3-7, 2005 in Lake Buena Vista, FL, pp. 1571-1576.

Einfeld W et al., "Evaluation of surface sampling method performance for *Bacillus* spores on clean and dirty outdoor surfaces," *Sandia Report No. SAND2011-4085*, Jun. 2011 (30 pp.).

Hastings JK et al., "A study of ignition time for materials exposed to DC arcing in PV systems," *IEEE 37th Photovoltaic Specialists Conference*, held on Jun. 19-24, 2011, in Seattle, WA, pp. 3724-3729.

Johnson J et al., "Parametric study of PV arc-fault generation methods and analysis of conducted DC spectrum," *IEEE 40th Photovoltaic Specialist Conference (PVSC)*, held on Jun. 8-13, 2014 in Denver, CO, pp. 3543-3548.

Kalejs J et al., "Connector issues in reliability," *NREL PV Module Reliability Workshop*, held on Feb. 26-27, 2013 in Golden, CO (1 p.), available at energy.gov/sites/prod/files/2014/01/f7/pvmrw13_ps3_ac_kalejs.pdf (last accessed May 23, 2017).

Ming K, "Hundreds of NorCal solar homes could catch fire," *CBS 13 News*, Nov. 4, 2013 (5 pp.), available at sacramento.cbslocal.com/2013/11/04/solar-panel-fire-danger-affects-hundreds-of-california-homes/ (last accessed May 23, 2017).

Müller P et al., "Characteristics of series and parallel low current arc faults in the time and frequency domain," *Proc. of the 56th IEEE Holm Conference on Electrical Contacts*, held on Oct. 4-7, 2010 in Charleston, SC, pp. 1-7.

Park YW et al., "Fretting corrosion of tin-plated contacts," *Tribology Int'l* 2008;41:616-28.

Rosenblum L, "Cost of photovoltaic energy systems as determined by balance-of-system costs," *NASA Technical Memorandum No. NASA TM-78957*, Jun. 1978 (15 pp.).

Saha H et al., "Impact of balance-of-system costs in photovoltaic electric power systems," *Solar Cells* 1983;8:125-36.

Schindelholz E et al., "Characterization of fire hazards of aged photovoltaic balance-of-systems connectors," *IEEE 42nd Photovoltaic Specialist Conference (PVSC)*, held on Jun. 14-19, 2015 in New Orleans, LA (6 pp.).

Schindelholz E et al., Poster titled "Characterization of fire hazards of aged photovoltaic balance-of-systems connectors," (1 p.), available at nrel.gov/pv/assets/pdfs/2015_pvmrw_61_schindelholz.pdf (last accessed May 23, 2017).

Shea JJ, "Identifying causes for certain types of electrically initiated fires in residential circuits," *Fire Mater.* 2011;35(1):19-42.

Wohlgemuth JH et al., "Reliability of PV systems," *Proc. SPIE* 2008;7048:art. 704802 (13 pp.).

Yang BB et al., "Arc fault risk assessment and degradation model development for photovoltaic connectors," *SAND Report No. SAND2014-4895C*, proposed for presentation at the *IEEE Photovoltaic Specialists Conference*, held Jun. 8-13, 2014 in Denver, CO (9 pp.).

Yang BB et al., "Arc fault risk assessment and degradation model development for photovoltaic connectors," *IEEE 40th Photovoltaic Specialist Conference*, held on Jun. 8-13, 2014 in Denver, CO, pp. 3549-3555.

Yang BB et al., "Reliability model development for photovoltaic connector lifetime prediction capabilities," *IEEE 39th Photovoltaic Specialists Conference (PVSC)*, held on Jun. 16-21, 2013 in Tampa, FL, pp. 139-144.

Yang BB et al., Poster titled "Photovoltaic BOS connector accelerated test for reliability model development and arc-fault risk assessment," *SAND Report No. SAND2014-1403C*, proposed for presentation at the 2014 PV Module Reliability Workshop, held Feb. 25-26, 2014 in Golden, CO (1 p.).

* cited by examiner

ARC PLASMA-GENERATING SYSTEMS AND METHODS THEREOF

CROSS-REFERENCE TO RELATED APPLICATION

This application claims the benefit of U.S. Provisional Application No. 62/342,580, filed May 27, 2016, which is hereby incorporated by reference in its entirety.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to systems for generating an arc fault in an electrical circuit, as well as methods thereof. In particular, the system provides a platform that can produce an arc discharge in a controlled manner, while measuring various parameters to characterize that discharge.

BACKGROUND OF THE INVENTION

Arc faults are hazardous events that can occur in photovoltaic systems. Unmitigated arc faults can result in system outages and cause fires that are life-threatening and damaging to the industry. Yet, characterizing the risk of arc faults remains a challenge. Various causes can contribute to this risk, such as aging electrical connectors, degrading photovoltaic modules, and interplays thereof; but critical data to derive a model for assessing risk are still missing. Thus, there is a need for systems and methods capable of obtaining such data to facilitate arc fault prognostics.

SUMMARY OF THE INVENTION

The present invention relates to systems and methods for generating an arc fault in a controlled manner, thereby allowing multiple parameters to be measured and analyzed for risk contributors to an arc discharge. In particular embodiments, such parameters include one or more experimental measurements that indicate the presence of an electrical disturbance or plasma in a tested electrical circuit.

Accordingly, in one aspect, the present invention encompasses a system (e.g., an automated system) for generating an arc fault in an electrical circuit. In some embodiments, the automated system includes a photovoltaic simulator configured to provide a constant power curve to the electrical circuit; and a motorized stage including a first arm adapted to hold a first component and a second arm adapted to hold a second component, where the first and second components are each connected to the electrical circuit but separated by a gap, and where the second arm is further configured to translate the second component for a measurable lateral distance that is greater than the gap. In particular embodiments, an increasing measurable lateral distance provides an increasing resistance between the first and second components, in which this increasing resistance contributes to the formation of an arc discharge between the first and second components.

The system can include any useful module configured to provide any useful measurement. Exemplary modules include an instrument configured to provide one or more current measurements, resistance measurements, and/or voltage measurements of the electrical circuit; a thermal detector configured to provide one or more temperature measurements in proximity to the first component and/or the second component; an optical spectrometer configured to detect one or more optical emission spectra in proximity to the first component and/or the second component; and/or an optical detector configured to provide one or more visual images in proximity to the first component and/or the second component. These modules can be employed in conjunction with, e.g., a data processor configured to record the one or more current measurements, resistance measurements, voltage measurements, temperature measurements, optical emission spectra, and/or visual images; and/or a data acquisition system configured to convert data from each module into an electrical signal capable of being received by the data processor, where the electrical signal can include the one or more current measurements, resistance measurements, voltage measurements, temperature measurements, optical emission spectra, and/or visual images. The data processor can be further configured to provide a frequency-domain analysis of the current and/or voltage measurements.

In another aspect, the present invention encompasses a method of generating and analyzing a generated arc fault. In some embodiments, the method includes: providing a system (e.g., any described herein, such as an automated system) configured to generate an arc fault between a first component and a second component that is separated by a gap in an electrical circuit; increasing a resistance between the first and second components by translating the second component for a first measurable lateral distance that is greater than the gap; obtaining a plurality of parameters during the increasing step; and applying one or more of the plurality of first parameters to determine whether or not increasing the resistance results in an arc discharge between the first and second components.

In particular embodiments, the system includes a photovoltaic simulator configured to provide a constant power curve to the electrical circuit.

In other embodiments, the parameters are selected from the group of a first measurable lateral distance, a first current measurement of the electrical circuit, a first resistance measurement of the electrical circuit, a first voltage measurement of the electrical circuit, a first temperature measurement in proximity to the first component and/or the second component, a first optical emission spectrum in proximity to the first component and/or the second component, and a first visual image in proximity to the first component and/or the second component. In some embodiments, the arc discharge is characterized by one or more of an increase in the first current measurement, an increase in the first resistance measurement, an increase in the first voltage measurement, an increase in the first temperature measurement, an increase in intensity of the first optical spectrum, and a presence of smoke or flame in the first visual image (e.g., as compared to a control measurement obtained prior to the increasing step).

In some embodiments, the method further includes (e.g., after the applying step): determining a lack of a presence of the arc discharge; further increasing a resistance a resistance between the first and second components by translating the second component for a second measurable lateral distance that is greater than the first measurable lateral distance; and further obtaining a plurality of second parameters during the further increasing step. In particular embodiments, the parameters are selected from the group of a second measurable lateral distance, a second current measurement of the electrical circuit, a second resistance measurement of the electrical circuit, a second voltage measurement of the electrical circuit, a second temperature measurement in proximity to the first component and/or the second component, a second optical emission spectrum in proximity to the first component and/or the second component, and a second visual image in proximity to the first component and/or the second component. Additional details follow.

Definitions

As used herein, the term "about" means+/−10% of any recited value. As used herein, this term modifies any recited value, range of values, or endpoints of one or more ranges.

As used herein, the terms "top," "bottom," "upper," "lower," "above," and "below" are used to provide a relative relationship between structures. The use of these terms does not indicate or require that a particular structure must be located at a particular location in the apparatus.

Other features and advantages of the invention will be apparent from the following description and the claims.

BRIEF DESCRIPTION OF THE DRAWINGS

FIG. 4 shows resistance measurements for three different connectors (Brand A, B, and C) as a function of position. The position at 0 mm represented the point of separation in which ohmic contact was last detectable between each mated end. The measurable lateral distance between each mated end was increased (as determined by the increasing distance between a position at 0 mm and a final position that provides the sustained arc, indicated by an X)

DETAILED DESCRIPTION OF THE INVENTION

The present invention relates to systems and methods configured to generate an arc fault, as well as to provide one or more experimental measurements to characterize the formation of an initial spark and the evolution into a sustained electric arc. An arc fault can be initiated by an arc discharge, which in turn can be characterized by an electric spark, plasma, or sustained electric arc. The presence and evolution of an arc discharge can be monitored by any experimental measurement, such as one or more current measurements (e.g., in which an increase or spike in current is indicative of an arc discharge), resistance measurements (e.g., in which an increase or spike in resistance is indicative of an arc discharge), voltage measurements (e.g., in which an increase or spike in voltage is indicative of an arc discharge), temperature measurements (e.g., in which an increase or spike in temperature is indicative of an arc discharge), optical emission spectra (e.g., in which the increased intensity at a particular wavelength or range of wavelengths is indicative of an arc discharge), and/or visual images (e.g., in which the presence of a flame or smoke is indicative of an arc discharge).

By generating an arc fault within an electrical circuit, the stability of circuit and its components can be assessed. For instance, electrical connectors are frequently employed in photovoltaic circuits to connect electrical systems together, and the stability of these electrical connectors can be analyzed by increasing resistance between the mated ends of the connectors and then measuring the conditions under which an arc discharge is observed between these mated ends. Controlled generation of an arc fault can provide valuable data, which in turn can be employed to develop a useful model to predict arc faults in photovoltaic systems. Any useful system can be employed to generate an arc fault.

Figure 1A:
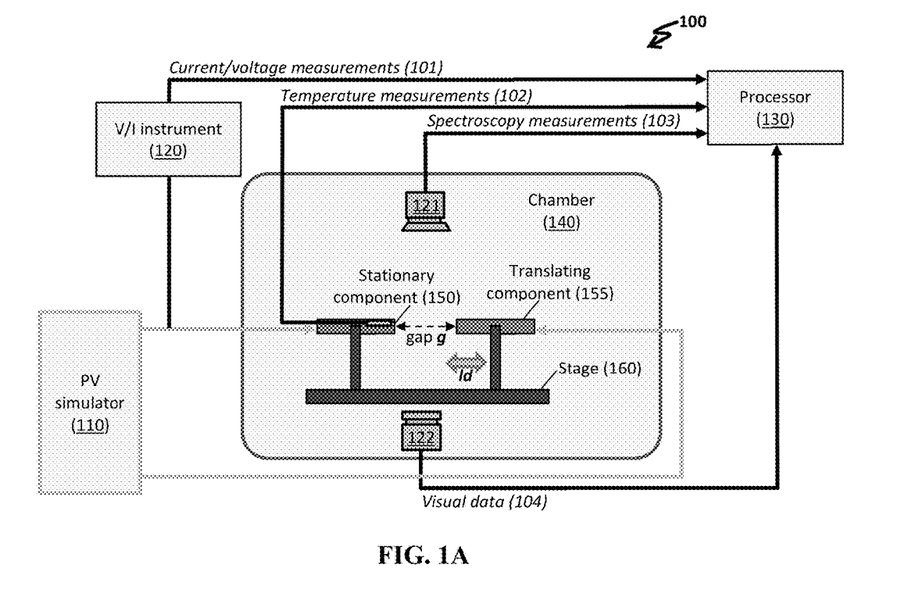
FIG. 1A-1C shows exemplary systems and methods for generating an arc fault in an electrical circuit. Provided is a non-limiting schematic of a system for generating an arc fault (FIG. 1A), in which the system 100 includes a photovoltaic simulator 110, a stage 160 adapted to hold components 150,155, modules 120,121,122 to provide one or more experimental measurements, and a processor 130 configured to record the one or more measurements. Also provided is an exemplary schematic (FIG. 1B) showing the use of component separation distance as a proxy for arc fault risk; and another non-limiting schematic of a system for generating an arc fault (FIG. 1C).

FIG. 1A provides an exemplary system 100 employed to generate an arc fault within an electrical circuit, in which the circuit includes a first component and second component. For instance, the first and second components can be a first end and a second end, respectively, of an electrical connector, in which the first and second ends can be mated ends. The system 100 can include a photovoltaic (PV) simulator 110 to provide constant power to the connected electrical circuit. The PV simulator can be programmed with curves (current-voltage curves) that provide constant power to the circuit with current and/or voltage limits (e.g., limited to 15 A and/or 600 V). Optionally, a power resistor is included to avoid shorting of the circuit.

The system 100 can include various modules to generate an arc fault under constant power, while to record continuous measurements of the component under test. An exemplary module includes a stage 160 (e.g., a motorized stage) including a first arm and a second arm. The first arm can be adapted to hold a first component (e.g., a stationary component 150), and the second arm can be adapted to hold a second component (e.g., a translating component 155). As can be seen in FIG. 1A, the first and second components are each connected to the electrical circuit but separated by a gap g. In addition, each of the first and second components is a conducting element within the electrical circuit. The first and second components are then pulled apart to a distance greater than the gap g, in which an increase in distance results in an increase in resistance between the first and second components. This increase in distance can be characterized by a measurable lateral distance ld in FIG. 1A, and this measurable lateral distance can be controlled by the stage 160 (e.g., a motorized stage having arms configured to hold the components and configured to translate in a controlled manner along the axis parallel to the gap g). In some embodiments, one of the arms is maintained as stationary, and the other arm can be translated along a measurable lateral distance.

Other modules include those configured to provide measurements (e.g., any useful measurement, such as one or more of any described herein). Exemplary modules include a first detector 120 configured to provide one or more current/voltage measurements 101 (e.g., an oscilloscope or a spectrum analyzer), a second detector configured to provide one or more temperature measurements 102 (e.g., a thermocouple), a third detector 121 configured to provide one or more spectroscopy measurements 103 (e.g., an optical spectrometer), and a fourth detector 122 configured to provide visual data 104 (e.g., a high speed charge-coupled device (CCD) or a high speed camera). Each of these detectors can be aligned and positioned in any useful manner. In one instance, the detector can be positioned in proximity to the gap between the first and second components; in proximity to one of the first and/or second components; and/or within a chamber 140 (e.g., an environmentally controlled chamber).

The system can include one or more modules configured to convert, filter, amplify, combine, receive, record, transmit, and/or analyze data relating to one or more measurements (e.g., any described herein, such as a measurement by a detector, in which an experimental parameter is provided by an electrical signal). An exemplary module includes a signal conditioning circuit configured to filter and/or amplify data and/or signals. Another exemplary module includes a data acquisition system configured to convert data from each module into an electrical signal capable of being received by the data processor. Yet another exemplary module includes an analog/digital converter configured to convert an analog signal into a digital signal (e.g., capable of being received and/or transmitted to a data processor). As seen in FIG. 1A, another exemplary module includes a signal data processor 130 (e.g., a computer) configured to record and/or the one or more current measurements, resistance measurements, voltage measurements, temperature measurements, optical emission spectra, and/or visual images. The data processor can be further configured to provide a frequency-domain analysis of the current and/or voltage measurements.

The systems and methods herein can be configured to control the separation distance between the first and second components, in which the extent of this separation distance can be a proxy for arc fault risk. The separation distance between the components can be quantified, e.g., as a measured lateral distance that is greater than a gap between the components, in which the gap can be set as the distance between the components in which ohmic contact between each component is detected. In one non-limiting instance, the first and second components are pulled apart until the point at which ohmic contact is last detected, and this point is designated as 0 mm. Then, the first and second components are further pulled apart at increments of a particular measurable lateral distance (e.g., at increments of 1 μm), and the increasing gap between the components are monitored for the presence of an arc discharge (e.g., monitored by way of recording one or more measurements, such as any described herein).

Figure 1B:
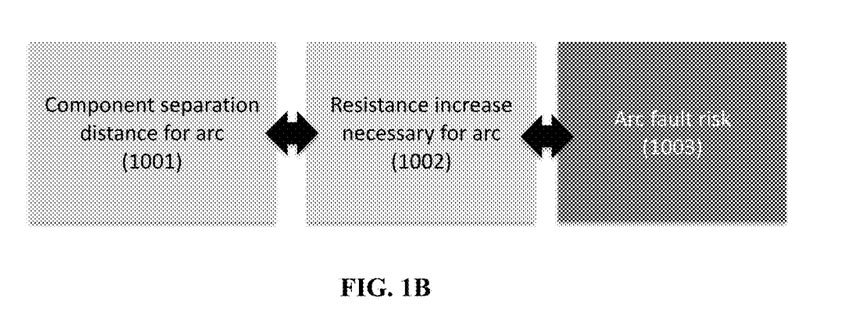

This pull-apart method can be a proxy for an arc fault, as seen in FIG. 1B. First, the first and second components are electrically connected to an electrical circuit, but a gap remains between the conductive first and second components. Then, the distance between the first and second components is monitored and gradually increased 1001, which in turn increases the resistance between the first and second components 1002. This increased resistance is similar to that observed in locally stressed or damaged regions of aging electrical components, and this increased resistance is responsible for forming an electrical arc discharge. The measured distance can reflect the risk of an arc fault. For instance, a shorter measured lateral distance can indicate greater instability of the components (e.g., greater likelihood of chemical degradation, of electrical shorting, etc.). In turn, a shorter measured lateral distance can indicate a greater risk for an arc fault 1003. In this way, component separation (e.g., as determined by the measured lateral distance) can be a proxy for arc fault risk. By measuring various parameters while separating the components, factors that contribute to increased arc fault risk can be determined.

Figure 1C:
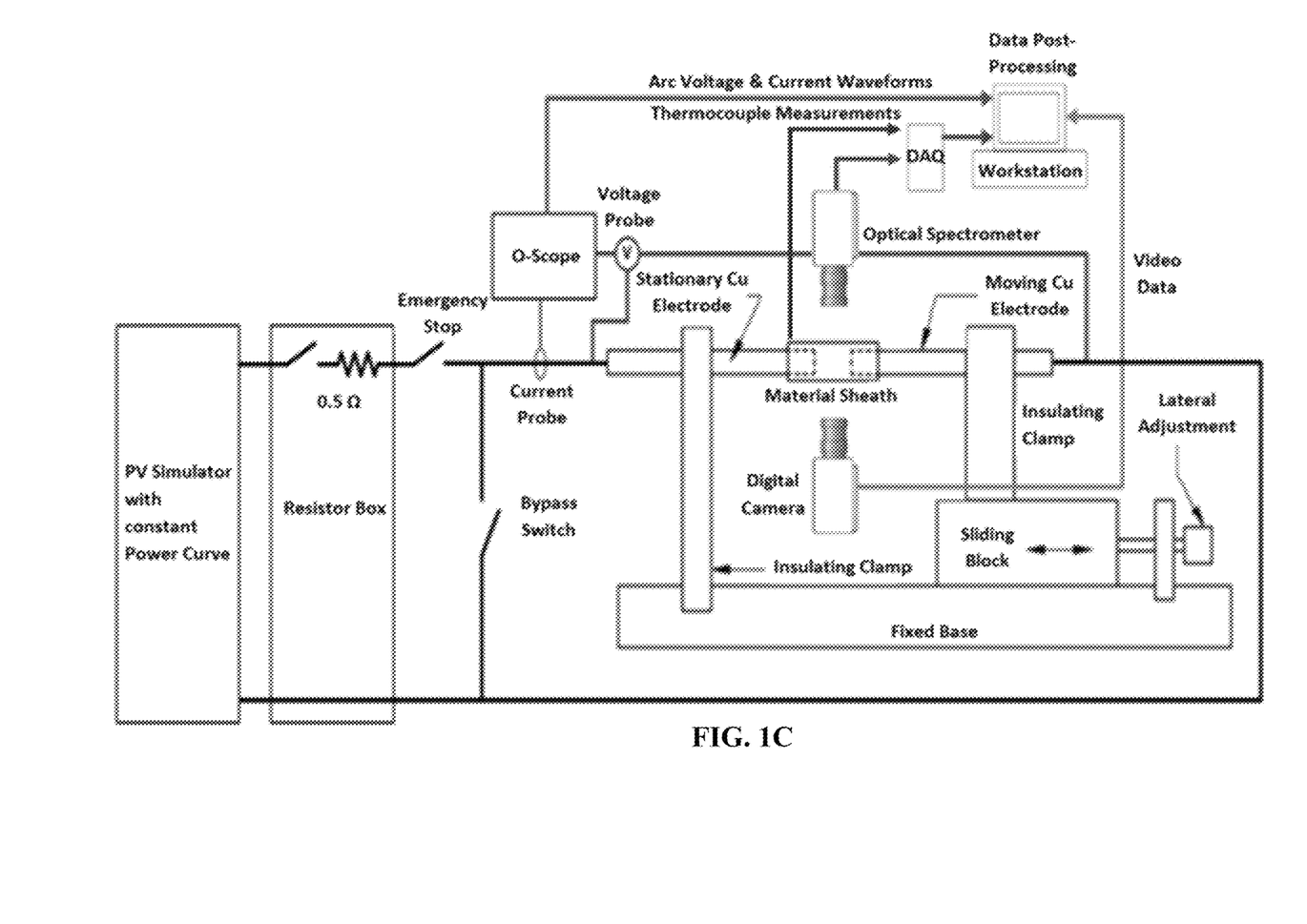

FIG. 1C provides an exemplary system for generating an arc fault in an electrical circuit. The circuit includes a first component (e.g., a stationary copper electrode, which can be replaced with one mated end of an electrical connector) and a second component (e.g., a moving copper electrode, which can be replaced with the other mated end of the electrical connector). The first and second component can optionally include a material sheath encompassing one end of each of the first and second components. The components can be mounted on a stage having a fixed base, in which one arm includes an insulating clamp and the other arm includes a moveable insulating clamp configured to be laterally adjusted (e.g., for a measurable lateral distance).

The arc fault test bed is powered by a photovoltaic simulator to produce a realistic response to the arc fault event (FIG. 1C). After initial benchmarking measurements, the copper electrodes are replaced with the connector under test.

Analysis techniques instrumented in the arc fault generator include voltage monitoring, current monitoring, and thermal measurements. As further seen in FIG. 1C, the exemplary system can also include various modules, such as an optical spectrometer to provide optical emission measurements, an instrument (e.g., an oscilloscope with accompanying voltage and current probes) to provide arc voltage and current waveforms, a thermocouple attached to the stationary electrode to provide temperature measurements, a digital camera to provide video data, at the gap, a data acquisition system (DAQ) to collect and record data, and a data processor (e.g., a workstation for post-processing of data). The electrical circuit can include any useful components to reduce electrical shorting and to provide constant power, such as by use of a PV simulator, switches, and resistors.

Figure 2A:
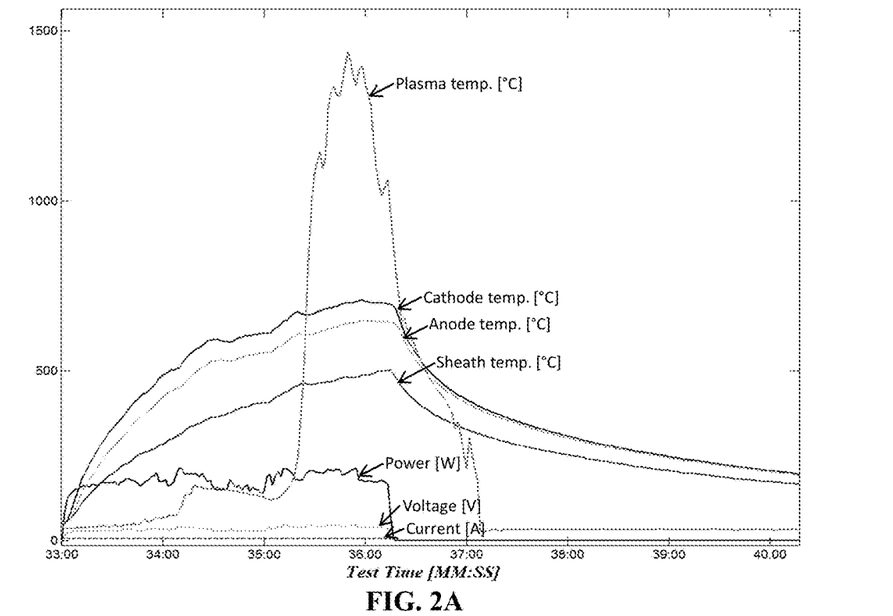
FIG. 2A-2C shows experimental measurements obtained from a system configured to generate an arc fault. Provided are graphs showing current, voltage, power, and temperature measurements (FIG. 2A); arc fault noise measurements analyzed by an integrated Fast Fourier Transform (FFT) sub-algorithm (FIG. 2B); and optical emission spectra in proximity to the tested connectors (FIG. 2C).
Figure 2B:
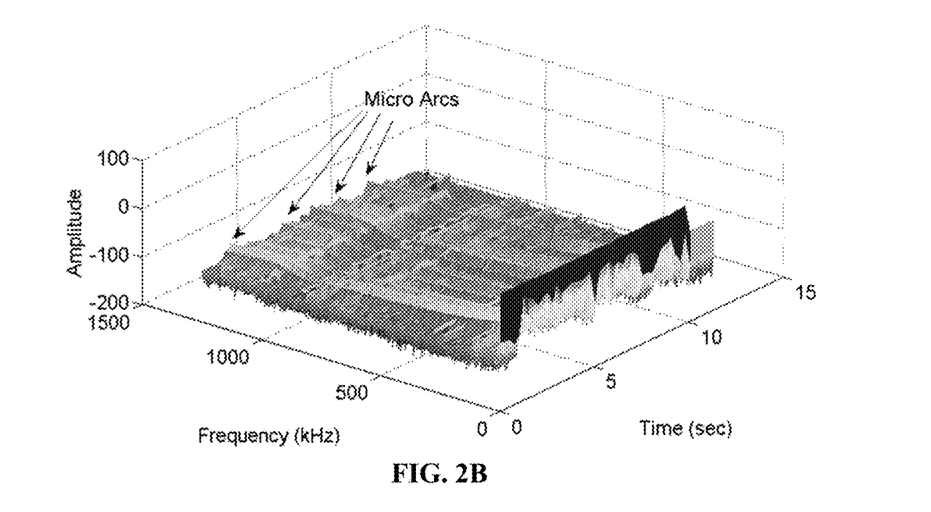
Figure 2C:
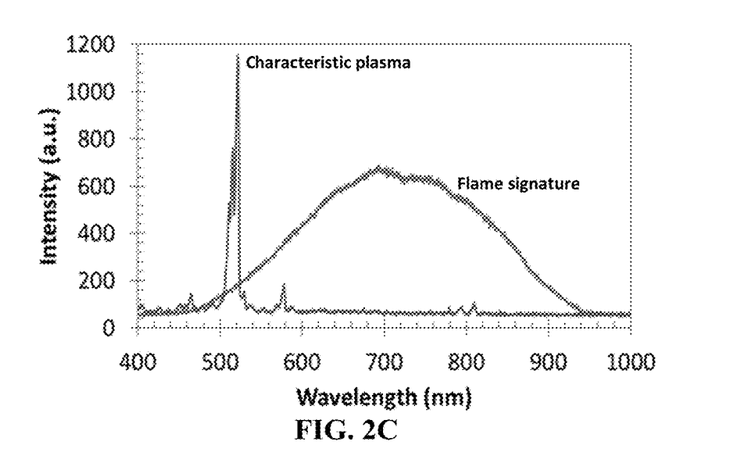
Figure 3:
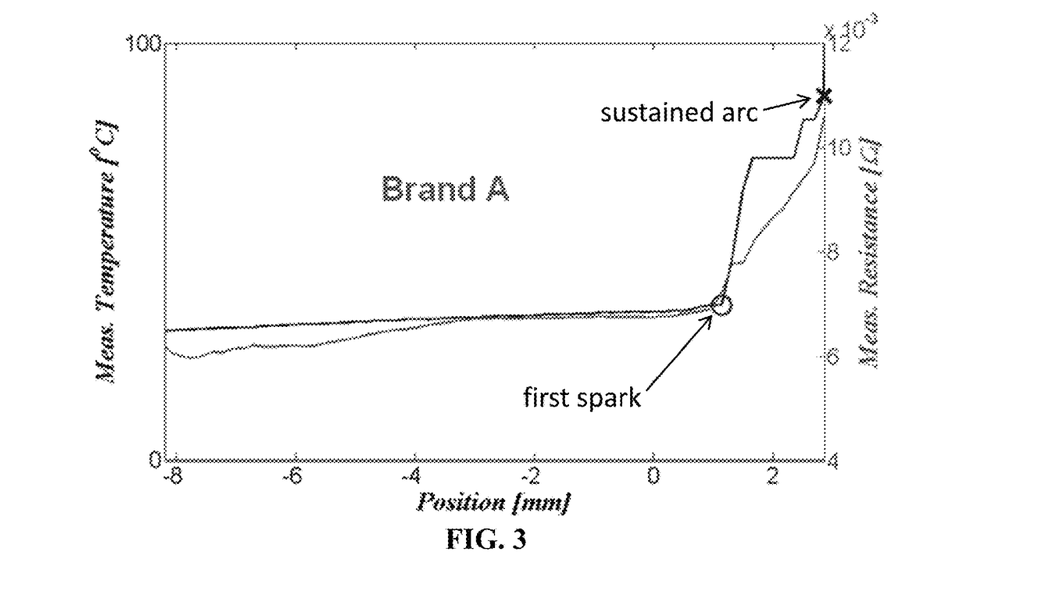
FIG. 3 shows temperature measurements and resistance measurements for a connector (Brand A) including two mated ends. The measurable lateral distance between each mated end was increased (as determined by the increasing distance between a position at 0 mm and the final position at about 3 mm), thereby increasing resistance between the ends. The position at −8 mm was the fully mated connectors, and the position at 0 mm represented the point of separation in which ohmic contact was last detectable between each mated end.
Figure 4:
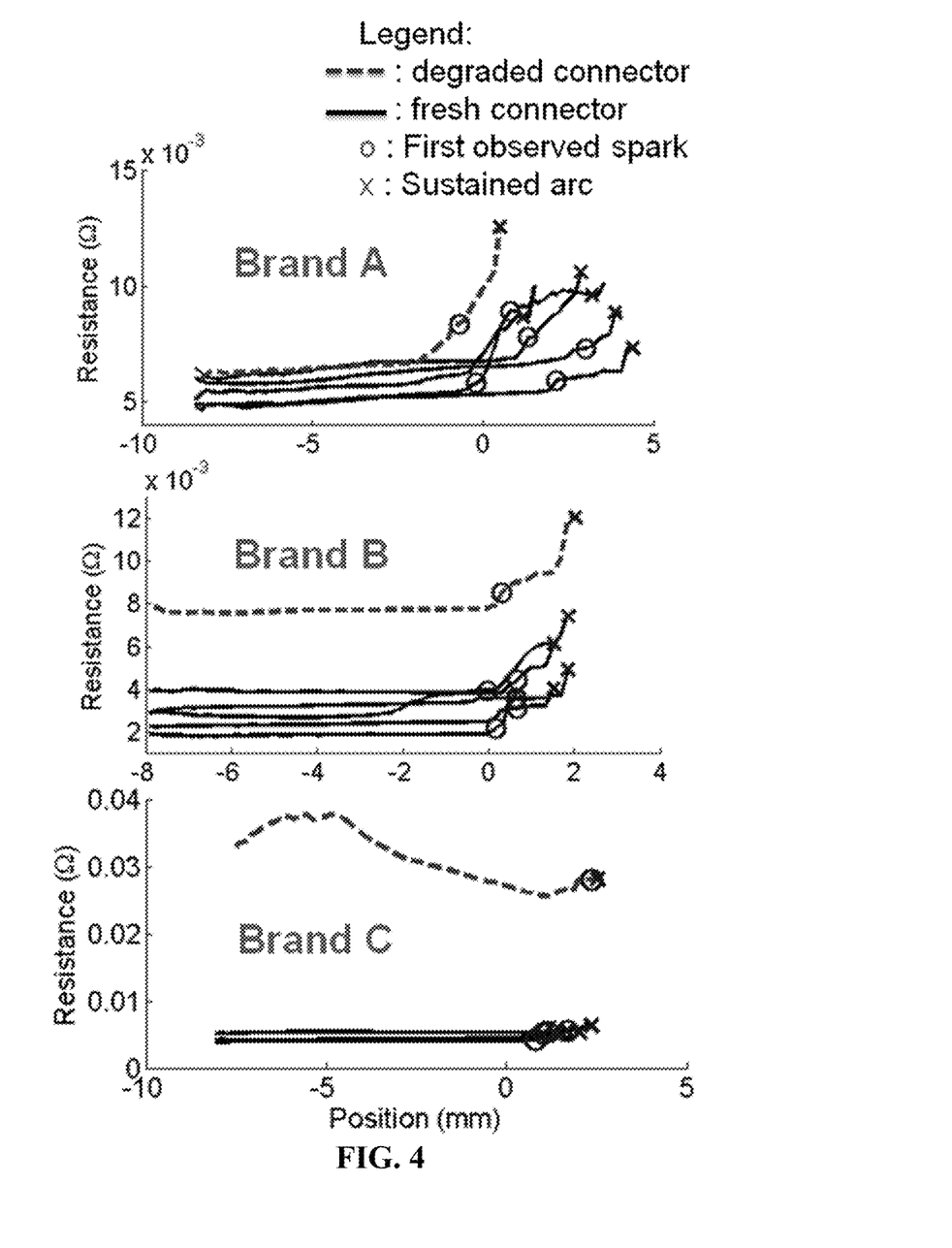
Figure 5:
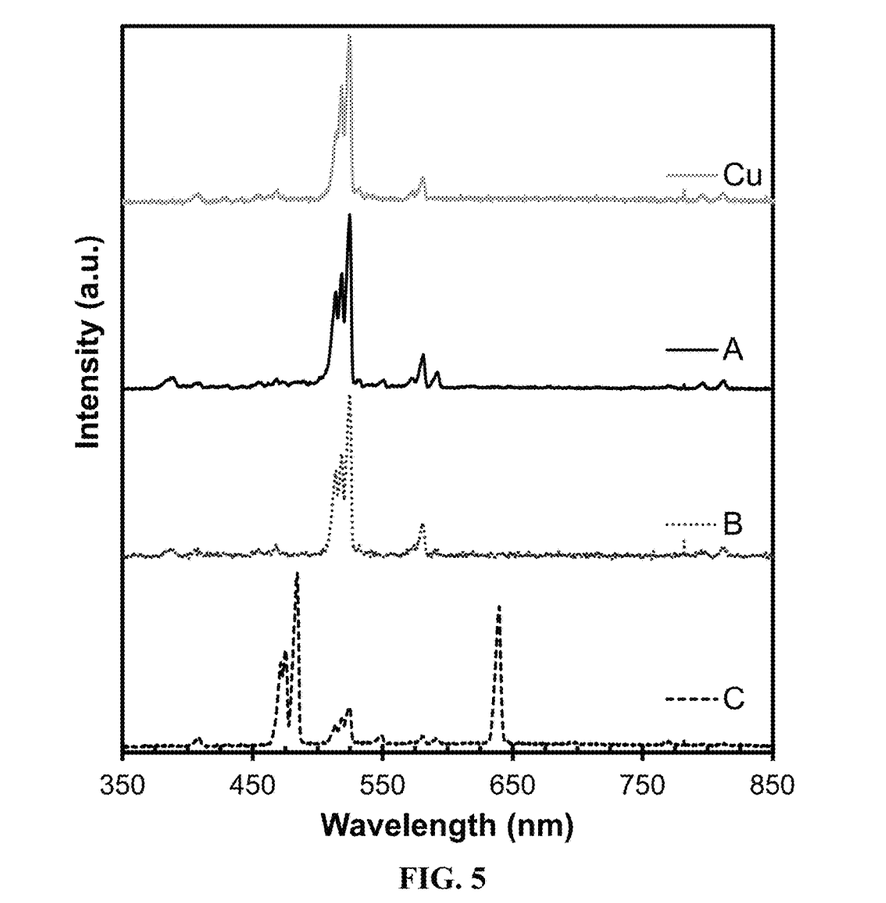
FIG. 5 shows optical emission spectra for three different connectors (Brand A, B, and C), as compared to a spectrum for copper electrodes (Cu). The presence of copper was readily apparent by the presence of common peaks labeled with the dashed lines. Connector A and Connector B, which are both tin-plated copper, had similar spectra. This similarity provided confidence in the technique as a method for materials analysis. The presence of alternate materials in Connector C was also detected by this technique in the form of additional peaks.

The systems and methods herein can be used to provide any useful combination of parameters. For instance, exemplary measurements include temperature, power, voltage, and current (e.g., as in FIG. 2A); electrical current spectrum with integrated Fast Fourier Transform analysis (e.g., as in FIG. 2B); and optical emission spectra (e.g., as in FIG. 2C). Temperature and resistance, as a function of measured lateral distance (e.g., position in FIG. 3) can be employed to determine the initial presence of a spark (indicated by circle in FIG. 3) and the presence of a sustained arc (indicated by X in FIG. 3). Such testing can be employed to test different connectors (e.g., balance of systems (BOS) connectors) under different conditions (e.g., as a new connector or a degraded connector), as seen in FIG. 4. Material analysis can be conducted by analyzing optical emission spectra (FIG. 5). Additional details are provided in the following Examples.

EXAMPLES

Example 1: Multi Parameter Thermal Plasmas Arc-Fault Generation and Data Acquisition System Certification of arc-fault detection and mitigation systems in PV systems and installations require an arc-fault generator to facilitate plasma discharges for varying power levels. Currently, no arc fault generator exists for the purpose of characterizing arc fault risk of PV systems, DC power systems, or AC power systems. The ability to control these discharges by fine adjustments is also necessary for ensuring a stable discharge between two current-carrying conductors.

Thus, the present invention, in part, relates to producing arc discharges at atmospheric pressures under a variety of environmental conditions and power levels (e.g., of from about 10 W to more than about 1 kW), which can span dark glow and arc discharge plasma regimes. In order to induce an arc fault, a first component and a second component (e.g., two mated pins for a connector) were gradually separated until arcing occurred. In situ voltage and current measurements were acquired during translation and used to calculate the resistance. The separation distance prior to the first detected spark as well as the translation necessary for a sustainable arc can be used to infer the relative risk of arc fault between connectors. While the connector pins are separated, the resistance across the connector rises due to a gradual decrease in surface area. If a decreased amount of translation is necessary to produce a sustainable arc, then the resistance increases and the connector disturbance needed to cause an arc fault event also increases.

Component separation was controlled by use of an automated stage, with modifications to translate the movable arm at desired increments. For instance, a fine motor control can be employed with the stage to ensure arc stability during operation, with controlled resolution of down to 1 μm in three spatial dimensions (e.g., to avoid pinch hazards). The fine resolution movement control can be capable of facilitating stable arc-discharges across current-carrying conductors under both automated and manual control. The electrified conductor arms are capable of holding cylindrical and non-cylindrical geometries of varying sizes, which can be useful in understanding the effect of conductor geometry on arc discharge. The arms can include the use of chucks to hold the component, in which the port can have a port to allow cabling to pass through to the current carrying circuit. The chucks are also capable of gripping current-carrying objects between 100 μm to 7.5 cm.

Power to the arc-fault generator can come from either a DC or AC power source, as well as from an artificial or renewable technology system power source. Integrated safety engineering controls include methods for disengaging the arc discharge, including interlock controls.

The integrated system can be provided within a chamber having the capability to implement different atmospheric environments for a more extensive reliability testing. In one instance, the generator system is enclosed within a sealed chamber environment and can facilitate arc-discharges in atmospheres of inert and non-inert gases including those used for testing long-duration reliability. The chamber can also be operated under vacuum and pressurized environments. Humidity levels between 0-100% relative humidity can also be introduced within the chamber.

The system is capable of monitoring current carrying conductor and bulk plasma temperatures. Voltage and current characteristics were monitored and logged via a spectrum analyzer. Integrated optical spectroscopy was capable of identifying material composition, electron temperatures, aerosol characterization, and bulk plasma temperatures. High-speed camera and smoke detection methods provide materials reliability integrity information, while also providing an indicator for arc discharge and flame.

Temperature can potentially be a method for arc fault prognostics, and the system is capable of monitoring the temperature of the current carrying conductors, objects adjacent to them, as well as of the bulk plasma. For instance, the arc fault generator system can include a high-temperature sensor for monitoring bulk temperatures of adjacently-positioned conductor materials, conductors and plasmas. This information can be used to determine a variety of physical and chemical phenomena of a degraded material.

The fully-integrated system described herein has direct applications in the areas of energy technologies, industrial applications (e.g., high temperature/variable-pressure applications), scientific research, materials testing (e.g., high-temperature/variable pressure testing or caustic/corrosive environmental testing), and materials forensics (e.g., as a material analysis tool). Specifically, it has requisite features to qualify PV materials, components and systems under certifying codes and standards, such as those by Underwriters Laboratory (UL), International Electrical Commission (IEC), and the National Electric Code (NEC) standards.

The system can be integrated with a multi-parameter data acquisition system (DAQ) to provide a deeper understanding of the discharge process. This system is capable of monitoring and controlling multiple electrical and thermal inputs, as well as a robotic stage with precision movement up to 1 μm resolution. In addition, data fusion algorithms can be used to integrate all detectors and motor control into a unified, high-speed data acquisition system capable of acquisition beyond 100 Hz. A high-speed sub-algorithm can be implemented to determine the presence of micro and macro-bulk arc discharges. Another algorithm can be employed to measure electron and bulk plasma temperature based on optical spectral measurements. The algorithm can use data from an optical spectrometer that is positioned perpendicular to the components. In addition to determining plasma temperatures through the algorithm, the spectrum information can also be used to identify material composition through elemental emission peaks.

Furthermore, an integrated Fast Fourier Transform (FFT) sub-algorithm was capable of obtaining novel electrical current spectrum beyond 500 kHz that can be used for a variety of photovoltaic device qualifications and detection of micro-arcs. For instance, the FFT sub-algorithm is capable of obtaining FFT data of electrical current spectrum with up to 5 MHz with 1 kHz resolution. This feature can be used to detect micro and macro-bulk arc discharges, as well as determine nuisance tripping and false-positive arc-faults in detection devices and systems.

Example 2: Translating Degradation into Arc Fault Risk

Arc faults are a low-probability, high-consequence hazard in photovoltaic (PV) systems. The rate of arc faults is expected to increase as the worldwide installed capacity of photovoltaic systems continues to grow. In the U.S. alone, there have been a number of high profile fires caused by arcing in PV systems (see, e.g., Shea J J, "Identifying causes for certain types of electrically initiated fires in residential circuits," *Fire Mater.* 2011; 35(1):19-42; and Brooks B, "The ground-fault protection blind spot: a safety concern for larger photovoltaic systems in the United States," Solar American Board for Codes and Standards Report, January 2012, 18 pp.). Some of these incidents have been traced to balance of systems (BOS) connectors, with risk and prevention being identified as a critical area to address (see, e.g., Yang B B et al., "Arc fault risk assessment and degradation model development for photovoltaic connectors," *IEEE* 40*th Photovoltaic Specialist Conference*, held on 8-13 Jun. 2014 in Denver, Colo., pp. 3549-55). The reliability of BOS connectors has been relatively uncharacterized beyond qualification tests.

Connector contact degradation can result in ohmic power loss and arc fault hazards, which in turn can result in burdensome costs and grave consequences. Although series arc faults that result from BOS connectors are low probability, they can have highly damaging consequences. Arc faults related to BOS connectors have been documented, and its prevention has been identified as a critical knowledge gap (see, e.g., Kalejs J et al., "Connector issues in reliability," *NREL PV Module Reliability Workshop*, held on 26-27 Feb. 2013 in Golden, Colo. (1 p.), available at energy.gov/sites/prod/files/2014/01/f7/pvmrw13_ps3_ac_kalejs.pdf; and Ming K, "Hundreds of NorCal solar homes could catch fire," CBS 13 News, Nov. 4, 2013, accessible at sacramento.cbslocal.com/2013/11/04/solar-panel-fire-danger-affects-hundreds-of-california-homes/).

Physically, there are situations in which overheated wiring can lead to arcing events. Conversely, arcing can lead to overheating with subsequent combustion of connectors or wire insulation. In most electrical and PV applications, series arc faults are typically more common than parallel arc faults (see, e.g., Müller P et al., "Characteristics of series and parallel low current arc faults in the time and frequency domain," *Proc. of the 56th IEEE Holm Conference on Electrical Contacts*, held on 4-7 Oct. 2010, in Charleston, S.C., pp. 1-7). Series arc faults can occur when the connection failure is in series with the load and can generally produce high current with a magnitude that depends on the faulted circuit.

Research by Shea (*Fire Mater.* 2011; 35(1):19-42) on residential wire-related arc faults found that, even without defects, wiring can be subjected to high thermal stresses because of currents at or above the conductor or thermal insulation ratings. These results found conductor wire and insulation material ratings can be exceeded when conducting rated current and currents at 110% of the wire ratings. This type of thermal stress can increase wire aging, especially in the presence of humidity (see, e.g., Hastings J K et al., "A study of ignition time for materials exposed to DC arcing in PV systems," *IEEE* 37*th Photovoltaic Specialists Conference*, held on 19-24 Jun. 2011, in Seattle, Wash., pp. 3724-9) and can accelerate material degradation that increases brittleness of connector insulating materials and crack formation of the conductor wires.

Further research by Armijo K M et al. ("Characterizing fire danger from low-power photovoltaic arc-faults," *IEEE* 40*th Photovoltaics Specialists Conference*, held on 8-13 Jun. 2014, in Denver, Colo., pp. 3384-90) also found that geometrical variations in wire electrodes can have a significant impact on facilitating and sustaining an arc. In their study, they found that a 50% reduction in the geometry of current conducting electrodes resulted in a reduction as high as 45% in arc discharge ignition time. In addition, current progress towards developing a degradation model for BOS connectors has been limited. To date, there has also not been research that relates any degradation model predictions to the likelihood of arc fault event. Presently, we seek to address this issue by using accelerated test and field test results for future development of a degradation model for BOS connectors.

In this investigation, laboratory and field aging of three connector designs common to industry was performed to determine the arc fault hazard potential against a pristine-condition control group. An arc fault generator and test methodology was developed and applied on new and aged connectors as a potential means of assessing arc fault risk of BOS connectors. Connector separation distance can be a proxy for arc fault risk (FIG. 1B), and the methodology included a system that controls that separation distance (FIG. 1C).

The arc fault behavior of select as-received and aged connector pins and socket sets was characterized using an arc fault generator, similar in description and function to that used by Johnson J et al. ("Parametric study of PV arc-fault generation methods and analysis of conducted DC spectrum," *IEEE* 40*th Photovoltaic Specialist Conference*, held on 8-13 Jun. 2014, in Denver, Colo., pp. 3543-8). A PV simulator running a constant power 300 W I-V curve was used as the power source (FIG. 1C). Voltage, current and connector surface temperature were captured at a rate of 2 Hz during these tests. In these experiments, power was run across a set of connectors under test while simultaneously separating a fully mated connector at 0.09 mm/s using a motorized linear stage until a sustained arc occurred. Resistance across the connector pin and socket rises during separation due to a gradual decrease in contact area. If a decreased amount of translation is necessary to produce a sustainable arc, then the resistance increases and the connector disturbance needed to cause an arc-fault event also increases. The separation distance prior to the first detected spark as well as that required for a sustainable arc was examined as a means to infer the relative risk of arcing between contacts in a connector. The intermittent and sustained arcing events were visually observed and position noted during the experiments. The employed separation velocity was found to provide sufficient time for a sustained arc to develop as a result of separation.

Figure 6:
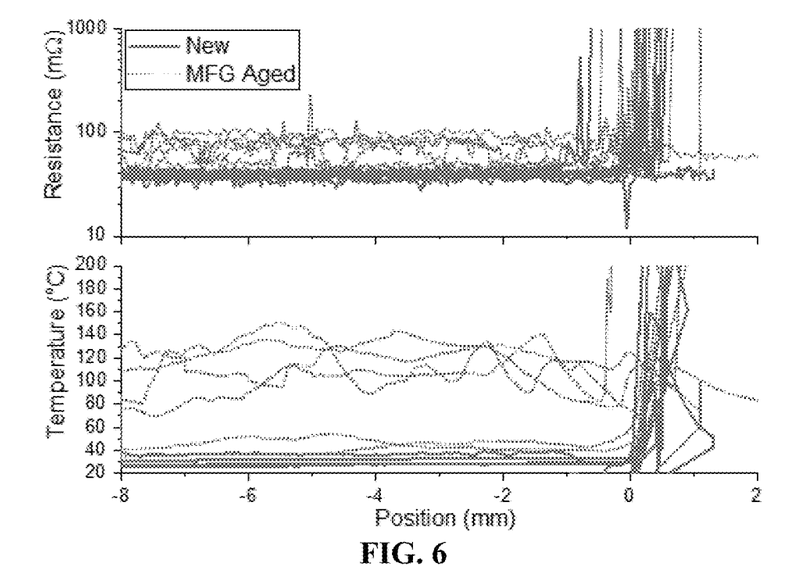
FIG. 6 shows resistance measurements (top) and temperature measurements (bottom) as a function of separation distance for new connectors and aged connectors. The position at −8 mm was the fully mated connectors, and the position at 0 mm represented the point of separation in which ohmic contact was last detectable between each mated end of the connector. The measurable lateral distance between each mated end was increased (as determined by the increasing distance between a position at 0 mm and the final position at a positive distance greater than 0 mm).

The arc fault behavior of a Type 1 set of 10 new and 6 connector pins that were boldly exposed (no housing) to the mixed flowing gas (MFG) test environment was explored using the arc generator. FIG. 6 is a plot of the resistance and temperature measured as a function of position for these connectors. The position at −8 mm is the fully mated connector, and the position at 0 mm is indicative of the last point of ohmic contact of the pin and socket upon separation as determined by a digital multimeter prior to each experiment. The average resistance of the fully mated aged connectors was 30 mΩ higher than that of the new connectors. The impact of this higher resistance is apparent in the temperature measurements that are near 100° C. for most of the aged connectors prior to separation. The onset of arcing was reflected in spikes in the temperature and resistance trends near the 0 mm position. Once sustained arcing was achieved during the separations, the power was cut off, which was resulted in a decrease in temperature after the spikes.

Figure 7:
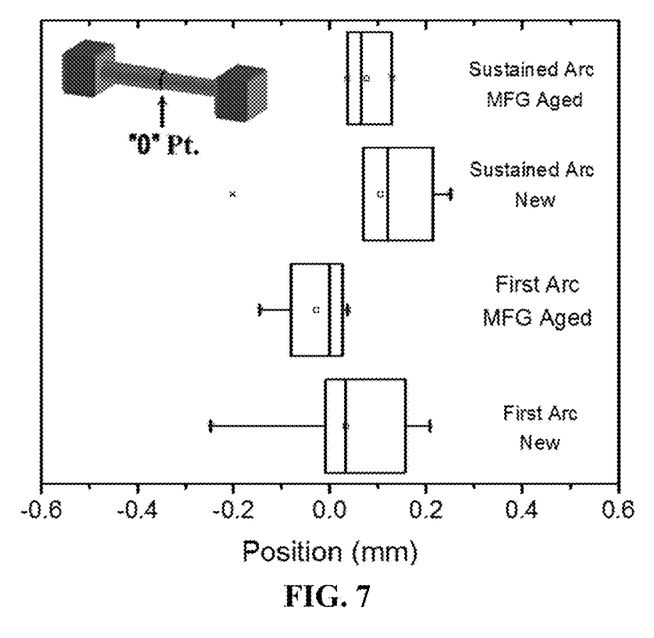
FIG. 7 shows a distribution of positions at which the first intermittent and sustained arcs were observed during arc fault experiments. The position at 0 mm represented the point of separation in which ohmic contact was last detectable between each mated end of the connector. Positive position values indicate a separation distance (a measurable lateral distance) from this position at 0 mm.

Comparison of the separation positions at which the first intermittent arc and a sustained arc were observed during each experiment is given in FIG. 7. There appears to be no significant difference between new and aged connectors with regard to the positions at which arcs occurred. Similarly, examination of the position at which resistance spiked during the experiments revealed no clear differentiation between the new and aged connectors.

The results of these tests in combination with the arc fault experiments (FIG. 6) suggest that if the housing of the Type 1 connectors were to be compromised in a sulfur-rich atmosphere for an appropriate amount of time, corrosion-induced joule heating could lead to arc fault conditions. The housing presumably shielded the contacts from the corrosive MFG atmosphere. Postmortem analyses similar to those carried out for the MFG tests are necessary to relate the resistance trends in the damp heat tests to the realized degradation of the electrical contacts.

The results for the connector arc fault revealed using a small sample size yielded no considerable difference between the separation distance needed to arc new and MFG-aged connectors, but several important conclusions can be drawn from these results. The results did show that arcs occur before the specified gap spacing of several millimeters indicated in the UL1699B standard for arc fault tests between two electrodes. In this work, we found both intermittent and sustained arcing to occur within several hundred microns of contact separation, and in some cases before separation FIG. 6. This suggests that the UL standard spacing should be revisited for arc fault testing of connector pin and socket geometries. Additionally, visual observation of arcs as a function of position during connector separation is subjective with respect to the observer and may be a major source of the variance seen in the results. One means of reducing this uncertainty would be to determine the onset of an arc through FFT analysis of the current signal during the separation test.

Other Embodiments

All publications, patents, and patent applications mentioned in this specification are incorporated herein by reference to the same extent as if each independent publication or patent application was specifically and individually indicated to be incorporated by reference.

While the invention has been described in connection with specific embodiments thereof, it will be understood that it is capable of further modifications and this application is intended to cover any variations, uses, or adaptations of the invention following, in general, the principles of the invention and including such departures from the present disclosure that come within known or customary practice within the art to which the invention pertains and may be applied to the essential features hereinbefore set forth, and follows in the scope of the claims.

Other embodiments are within the claims.

The invention claimed is:

1. An automated system for generating an arc fault in an electrical circuit, the automated system comprising:
a photovoltaic simulator configured to provide a constant power curve to the electrical circuit;
a motorized stage comprising a first arm adapted to hold a first component and a second arm adapted to hold a second component, wherein the first and second components are each connected to the electrical circuit but separated by a gap, wherein the second arm is further configured to translate the second component for a measurable lateral distance that is greater than the gap, and wherein an increasing measurable lateral distance provides an increasing resistance between the first and second components;
an instrument configured to provide one or more current measurements, resistance measurements, and/or voltage measurements of the electrical circuit;
a thermal detector configured to provide one or more temperature measurements in proximity to the first component and/or the second component;
an optical spectrometer configured to detect one or more optical emission spectra in proximity to the first component and/or the second component;
an optical detector configured to provide one or more visual images in proximity to the first component and/or the second component; and
a data processor configured to record the one or more current measurements, resistance measurements, voltage measurements, temperature measurements, optical emission spectra, and/or visual images.

2. The system of claim 1, further comprising:
a power resistor configured to be electrically connected to the photovoltaic stimulator and disposed between the photovoltaic simulator and the first and second components.

3. The system of claim 1, wherein the stage is enclosed within an atmospherically controlled chamber.

4. The system of claim 1, wherein the one or more temperature measurements comprise a temperature of the first component, a temperature of the second component, or a temperature of plasma generated between the first and second components.

5. The system of claim 1, wherein the data processor further comprises a controller to translate the second arm for the measurable lateral distance with up to 1 µm resolution and to translate the second arm in any x-, y-, and/or z-direction.

6. The system of claim 1, wherein the first component comprises a first portion of an electrical connector and the second component comprises a second portion of an electrical connector.

7. The system of claim 1, wherein the first component comprises a first electrode and the second component comprises a second electrode.

8. The system of claim 1, wherein the first and/or second arm comprises a port configured to relay a cable that is electrically connected to the electrical circuit.

9. The system of claim 1, wherein a central axis of the optical spectrometer is positioned to be perpendicular to a direction of the measurable lateral distance.

10. The system of claim 1, wherein the data processor is further configured to provide a frequency-domain analysis of the current and/or voltage measurements.

11. The system of claim 10, further comprising:
a data acquisition system configured to convert data from the instrument, the thermal detector, the optical spectrometer, and the optical detector into an electrical signal capable of being received by the data processor, wherein the electrical signal comprises the one or more current measurements, resistance measurements, voltage measurements, temperature measurements, optical emission spectra, and/or visual images.

12. The system of claim 1, wherein the instrument comprises an oscilloscope or a spectrum analyzer configured to measure a current waveform.

13. The system of claim 12, wherein the oscilloscope or the spectrum analyzer is configured to be electrically connected to a current probe and/or a voltage probe.

14. A method of generating and analyzing a generated arc fault, the method comprising:
providing an automated system configured to generate an arc fault between a first component and a second component that is separated by a gap in an electrical circuit, wherein the automated system comprises a photovoltaic simulator configured to provide a constant power curve to the electrical circuit;
increasing a resistance between the first and second components by translating the second component for a first measurable lateral distance that is greater than the gap;
obtaining a plurality of parameters during the increasing step, wherein the parameters are selected from the group consisting of the first measurable lateral distance, a first current measurement of the electrical circuit, a first resistance measurement of the electrical circuit, a first voltage measurement of the electrical circuit, a first temperature measurement in proximity to the first component and/or the second component, a first optical emission spectrum in proximity to the first component and/or the second component, and a first visual image in proximity to the first component and/or the second component; and
applying one or more of the plurality of first parameters to determine whether or not increasing the resistance results in an arc discharge between the first and second components, wherein the arc discharge is characterized by one or more of an increase in the first current measurement, an increase in the first resistance measurement, an increase in the first voltage measurement, an increase in the first temperature measurement, an increase in intensity of the first optical spectrum, and a presence of smoke or flame in the first visual image, as compared to a control measurement obtained prior to the increasing step.

15. The method of claim 14, wherein the applying step comprises applying an integrated Fast Fourier Transform algorithm to one or more current measurements in order to determine a presence of an arc discharge.

16. The method of claim 14, wherein the applying step comprises applying an algorithm to one or more optical spectra to determine a presence of an arc discharge.

17. The method of claim 14, further comprising, after the applying step:
determining a lack of a presence of the arc discharge;
further increasing a resistance between the first and second components by translating the second component for a second measurable lateral distance that is greater than the first measurable lateral distance; and
further obtaining a plurality of second parameters during the further increasing step, wherein the parameters are selected from the group consisting of the second measurable lateral distance, a second current measurement of the electrical circuit, a second resistance measurement of the electrical circuit, a second voltage measurement of the electrical circuit, a second temperature measurement in proximity to the first component and/or the second component, a second optical emission spectrum in proximity to the first component and/or the second component, and a second visual image in proximity to the first component and/or the second component.

18. The method of claim 17, further comprising, after the further obtaining step:
further applying one or more of the plurality of second parameters to determine whether or not increasing the resistance results in an arc discharge between the first and second components, wherein the arc discharge is characterized by one or more of an increase in the second current measurement, an increase in the second resistance measurement, an increase in the second voltage measurement, an increase in the second temperature measurement, an increase in intensity of the second optical spectrum, and a presence of smoke or flame in the second visual image, as compared to one of the corresponding plurality of first parameters.

* * * * *